United States Patent [19]

Horii et al.

[11] 4,454,216

[45] Jun. 12, 1984

[54] METHOD FOR MAKING IMPROVED LITHOGRAPHIC PRINTING PLATE

[75] Inventors: Shoichi Horii; Eiji Kanada; Mamoru Nakatani, all of Nagaokakyo, Japan

[73] Assignee: Mitsubishi Paper Mills, Ltd., Tokyo, Japan

[21] Appl. No.: 390,797

[22] Filed: Jun. 21, 1982

[30] Foreign Application Priority Data

Jun. 23, 1981 [JP] Japan .................. 56-97241
Mar. 12, 1982 [JP] Japan .................. 57-40006

[51] Int. Cl.³ .................. G03C 5/54; G03F 7/02
[52] U.S. Cl. .................. 430/204; 430/302
[58] Field of Search .......... 430/204, 251, 234, 233, 430/248, 455, 456, 965, 302

[56] References Cited

U.S. PATENT DOCUMENTS

| | | | |
|---|---|---|---|
| 3,068,098 | 12/1962 | Williams | 430/233 |
| 3,577,240 | 5/1971 | Nishio et al. | 430/233 |
| 3,712,818 | 1/1973 | Nittel et al. | 430/456 |
| 3,721,559 | 3/1973 | De Haes et al. | 430/204 |
| 3,776,728 | 12/1973 | Suzuki et al. | 430/204 |
| 4,297,430 | 10/1981 | Kanada et al. | 430/204 |
| 4,309,499 | 1/1982 | Takagi et al. | 430/251 |

*Primary Examiner*—Richard L. Schilling
*Attorney, Agent, or Firm*—Cushman, Darby & Cushman

[57] ABSTRACT

A lithographic printing plate with a markedly improved printing endurance is obtained by the silver complex diffusion transfer process when the diffusion transfer development treatment is carried out in the presence of at least one thione compound having a non-enolizable thione group, an adjacent nitrogen atom with an attached substituent R and represented by >N-R, and a group of atoms selected from carbon, nitrogen, oxygen and sulfur atoms which may carry the substituent R, said group of atoms being necessary for forming a 5- or 6-membered ring having no aromatic condensed ring, said substituent R having 1 to 3 carbon atoms or no carbon atom.

10 Claims, No Drawings

METHOD FOR MAKING IMPROVED LITHOGRAPHIC PRINTING PLATE

The invention relates to a method for making a lithographic printing plate by the silver complex diffusion transfer process. More particularly, it relates to a method for making a lithographic printing plate which is markedly improved in printing endurance.

One of the disadvantages accompanying the lithographic printing plate prepared by the conventional silver complex diffusion transfer process (DTR process) is a gradual decrease in ink receptivity of hydrophobic areas carrying an inked image caused by the insufficient resistance against mechanical abrasion, resulting in a decrease in printing endurance. Another disadvantage is that non-image areas or ground areas become susceptible to ink staining during the printing operation because of the gradual change of hydrophilic areas into hydrophobic ones. A further disadvantage is a damage to the uniformity of greasy ink receptivity of the hydrophobic image areas, which results in fluctuation of ink receptivity of the image areas and, as a consequence, results in failure of the printing areas to receive a uniform quantity of ink.

There is already known printing plates which utilize as ink receptive areas a metallic silver pattern formed by DTR process [for example, U.S. Pat. Nos. 3,220,837 and 3,721,559; Japanese Patent Publication Nos. 16,725/73 and 30,562/73; Japanese Patent Application "Kokai" (Laid-open) Nos. 4,482/71 and 21,602/78]. A few of them have been in actual use, but still retain the above-noted disadvantages.

Similarly to other lithographic printing plate, the lithographic printing plate prepared by the DTR process is required to improve the printing endurance to an extent which depends upon the construction of plate material, composition of the processing solutions, or printing conditions. The condition of silver grains formed by the transfer development is one of the important factors affecting the printing characteristics of the printing plate. In order that the silver grains formed by the transfer development be more durable in printing, the important factors are the conditions of formation of transferred silver grains such as, for example, the rate of diffusion, stability and rate of reduction of the silver complex, as well as the size and shape of the silver grains thus formed, though the printing endurance depends partly upon the construction of the plate material.

It is described in Japanese Patent Application "Kokai" (Laid-open) No. 26,201/72 that by using a transfer developer comprising essentially a developing agent, a solvent for silver halides, and an organic compound having a mercapto group or a thione group, it is possible to obtain high quality copies with satisfactory ink spread in the initial stage of printing. The printing plate obtained by this method, however, is still unsatisfactory in the performance level to exhibit a high printing endurance while retaining the characteristics of a lithographic printing plate made by the DTR process, such as excellent image reproducibility and a high photosensitivity suitable for the direct printing plate making. Therefore, a pronounced improvement in the printing endurance is required. On the other hand, in view of the effective utilization of silver resource, it is desirable to reduce the silver content of silver halide emulsion layer, but the printing endurance generally declines with the decrease in silver content. Accordingly, it is required to provide a lithographic printing material having more improved printing endurance in spite of the low silver content and also to provide a method of processing such a material.

Beside a method of diffusion transfer development with an alkaline processing solution containing a developing agent such as hydroquinone, described in the above-noted Japanese Patent Application "Kokai" (Laid-open) No. 26,201/72, there is known a method of diffusion transfer development in which a photographic printing plate material containing a developing agent is treated with an alkali processing solution containing substantially no developing agent, that is, a so-called alkali activating solution. This method has an advantage of keeping the developing agent substantially from air oxidation to increase markedly the durability of processing solution. Such a high durability permits the processing of a large number of photographic printing plate materials, but accompanies the danger of processing with an exhausted solution, leading to unsatisfactory printing characteristics of the printing plate. It is, therefore, required to provide a method of making a printing plate, which prevents the printing plate from deterioration of printing characteristics, particularly printing endurance, even after a large number of photographic printing plate materials have been processed.

An object of this invention is to provide a method for making a lithographic printing plate of markedly improved printing endurance by the silver complex diffusion transfer process.

Another object of this invention is to provide a photographic material suitable for the treatment with an alkali activating solution to make a lithographic printing plate of high printing endurance as well as to provide a method of processing said photographic material.

A further object of this invention is to provide a lithographic printing plate of low silver content having markedly improved printing endurance as well as to provide a method of making said printing plate.

Other objects and advantages of this invention will become apparent from the following description.

The specific compound used in the method of this invention is a thione compound having a non-enolizable thione group, a substituted nitrogen atom represented by >N—R adjacent to said thione group and the remainder being a group of atoms selected from carbon, nitrogen, oxygen and sulfur atoms which may carry the substituent R, said group of atoms being necessary for forming a 5- or 6-membered ring having no aromatic condensed ring, said substituent R having 1 to 3, preferably 1 to 2 carbon atoms or no carbon atom.

The specific compound used in this invention is characterized by being such that (1) it has at least one non-enolizable thione group, (2) it is a heterocyclic compound having no aromatic condensed ring, (3) a nitrogen atom carrying a substituent group is in the position adjacent to said thione group, and (4) any of the substituents should not be those alkyl or aryl groups which have 4 or more carbon atoms.

Examples of the substituent groups attached to the nitrogen atom adjacent to the thione group include those which are bonded to the nitrogen atom through carbon, oxygen, sulfur, or nitrogen atom. If the substituent group has 4 or more carbon atoms, the thione compound was found to be not only unable to achieve the object of this invention but also to deteriorate the characteristics of a lithographic printing plate. As examples may be cited N—C bondable groups such as $C_{1-3}$ alkyl groups (e.g. methyl, ethyl, propyl, 2-sulfoethyl, carboxymethyl, 2-carboxyethyl, 2-hydroxyethyl, 2-methoxyethyl, methoxycarbonylmethyl, chloroethyl, and methanesulfonamidoethyl), $C_{1-3}$ alkenyl groups (e.g. allyl), N—O bondable groups such as hydroxyl group, alkoxyl groups (e.g. methoxy), and alkylcarbonyloxy groups (e.g. acetoxy and propionyloxy), and N—N bondable groups such as amino groups (e.g. amino, methylamino, and diethylamino), ureido groups (e.g. N,N-dimethylureid), thioureido groups, and alkylcarboxylamino groups (e.g. acetamido), etc. These examples are non-limitative. The carbon or nitrogen atom constituting the heterocyclic ring may carry the above-mentioned substituent. Further, in a 5-membered heterocyclic ring for example, the carbon atoms at positions 4 and 5 may be bonded through a methylene chain to form a saturated ring. Bis-configuration compounds made by binding above-mentioned compounds at 3, 4 or 5 position with carbon chain may also be included. The half of the carbon number in the carbon chain in the bis-configuration can be counted as the number of carbon atoms of the substituent.

The compound used in this invention may be represented by the general formula (I)

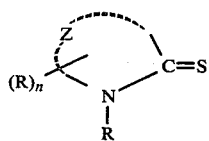
(I)

wherein Z is a group of atoms which are necessary for the formation of a 5- or 6-membered ring and are selected from atoms of C, N, O and S; R's, which may be the same or different, are substituents as defined previously; and n is 0 or an integer of 1 to 6.

Typical examples of thione compounds used in this invention are as shown below.

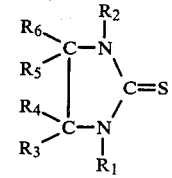

| No. | $R_1$ | $R_2$ | $R_3$ | $R_4$ | $R_5$ |
|---|---|---|---|---|---|
| 1 | —CH$_3$ | H | H | H | H |
| 2 | —CH$_3$ | —CH$_3$ | —CH$_3$ | H | H |
| 3 | H$_2$NCH$_2$— | H | H | H | H |
| 4 | C$_2$H$_5$— | H | H | H | H |

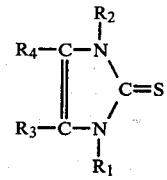

| No. | $R_1$ | $R_2$ | $R_3$ |
|---|---|---|---|
| 5 | —CH$_3$ | H | H |
| 6 | —C$_2$H$_5$ | H | H |

-continued

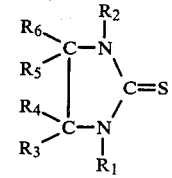

| No. | $R_1$ | $R_2$ | $R_3$ | $R_4$ | $R_5$ | $R_6$ |
|---|---|---|---|---|---|---|
| 7 | —CH$_3$ | —CH$_3$ | H | H | H | H |
| 8 | —CH$_3$ | NH$_2$C$_2$H$_4$— | H | H | H | H |
| 9 | HOCH$_2$— | HOCH$_2$— | —OH | H | —OH | H |
| 10 | —C$_2$H$_5$ | —C$_2$H$_5$ | H | H | H | H |
| 11 | —NH$_2$ | HOC$_2$H$_4$— | H | H | H | H |
| 12 | H$_2$NCH$_2$— | H$_2$NCH$_2$— | H | H | H | H |
| 13 | HOCH$_2$— | HOCH$_2$— | CH$_3$ | H | H | H |

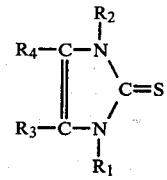

| No. | $R_1$ | $R_2$ | $R_3$ | $R_4$ |
|---|---|---|---|---|
| 14 | —CH$_3$ | —CH$_3$ | H | H |
| 15 | —C$_2$H$_5$ | —C$_2$H$_5$ | H | H |
| 16 | —CH$_3$ | —CH$_3$ | H$_2$NCH$_2$— | H |

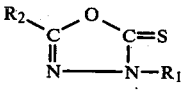

| No. | $R_1$ | $R_2$ |
|---|---|---|
| 17 | —CH$_3$ | H |
| 18 | —CH$_3$ | —CH$_3$ |
| 19 | ClCH$_3$ | —CH$_3$ |
| 20 | —C$_2$H$_5$ | H |
| 21 | HOCH$_2$— | —C$_2$H$_5$ |

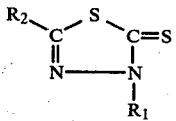

| No. | $R_1$ | $R_2$ |
|---|---|---|
| 22 | —CH$_3$ | CH$_3$S— |
| 23 | —CH$_3$ | CH$_3$NH— |
| 24 | —CH$_3$ | H |
| 25 | ClCH$_2$— | CH$_3$O— |
| 26 | —CH$_3$ | —CH$_3$ |
| 27 | HOCH$_2$— | —CH$_3$ |
| 28 | —CH$_3$ | —N(CH$_3$)$_2$ |

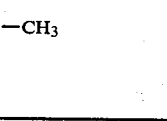

| No. | $R_1$ | $R_2$ | $R_3$ |
|---|---|---|---|
| 29 | —CH$_3$ | —CH$_3$ | —CH$_3$ |
| 30 | —CH$_3$ | —CH$_3$ | H |
| 31 | —CH$_3$ | CH$_3$CONH— | CH$_3$ |
| 32 | —CH$_2$Cl | —CH$_3$ | H |

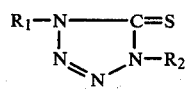

| No. | R₁ | R₂ |
|---|---|---|
| 33 | —CH₃ | —CH₃ |
| 34 | —C₃H₇ | —CH₃ |

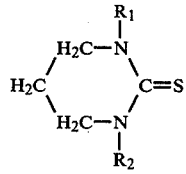

| No. | R₁ | R₂ |
|---|---|---|
| 35 | —CH₃ | —CH₃ |
| 36 | —C₂H₅ | —C₂H₅ |
| 37 | HOC₂H₄— | HOC₂H₄— |

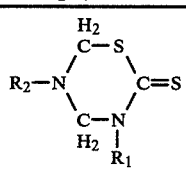

| No. | R₁ | R₂ |
|---|---|---|
| 38 | —CH₃ | —CH₃ |
| 39 | HOC₂H₄— | HOC₂H₄— |
| 40 | CH₂=CH.CH₂— | —CH₃ |

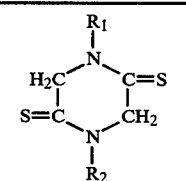

| No. | R₁ | R₂ |
|---|---|---|
| 41 | —CH₃ | —CH₃ |
| 42 | —C₂H₅ | —C₂H₅ |

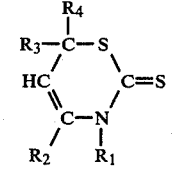

| No. | R₁ | R₂ | R₃ | R₄ |
|---|---|---|---|---|
| 43 | —CH₃ | H | H | H |
| 44 | —CH₃ | —CH₃ | —CH₃ | —CH₃ |
| 45 | —C₃H₇ | H | H | H |

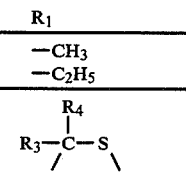

| No. | R₁ | X |
|---|---|---|
| 46 | —CH₃ | O |
| 47 | —CH₃ | S |
| 48 | —C₂H₅ | S |
| 49 | —C₂H₄OH | S |

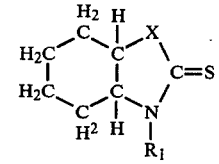

| No. | R₁ | X |
|---|---|---|
| 50 | —CH₃ | O |

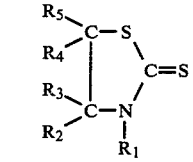

| No. | R₁ | R₂ | R₃ | R₄ | R₅ |
|---|---|---|---|---|---|
| 51 | CH₃ | H | H | H | H |
| 52 | C₂H₅ | H | H | H | H |
| 53 | CH₂CH₂OCH₃ | OH | CH₃ | H | H |
| 54 | C₂H₄OH | H | H | H | H |
| 55 | CH₃ | OH | CH₃ | H | H |
| 56 | CH₃ | OH | H | H | H |
| 57 | C₂H₅ | OH | CH₃ | H | H |
| 58 | C₂H₄OH | OH | CH₃ | H | H |
| 59 | CH₃ | CH₃ | H | H | CH₃ |
| 60 | CH₂CH₂Cl | H | H | H | H |
| 61 | CH₂OH | H | H | H | H |
| 62 | CH₃ | OH | CH₃ | H₂CH₂C OH | H |
| 63 | CH₃ | H₃CNH | H | H | H |

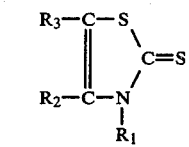

| No. | R₁ | R₂ | R₃ |
|---|---|---|---|
| 64 | C₂H₄COOH | CH₃ | H |
| 65 | CH₃ | H | H |
| 66 | CH₂COOH | CH₃ | H |
| 67 | CH₃ | CH₃ | H |
| 68 | C₂H₄OH | CH₃ | H |
| 69 | NH₂ | CH₃ | H |
| 70 | OH | CH₃ | H |
| 71 | CH₂—CH=CH₂ | C₂H₅ | CH₃ |
| 72 | CH₃ | H | CH₃CONH |

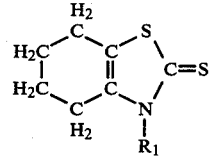

| No. | R₁ |
|---|---|
| 73 | CH₃ |
| 74 | C₂H₅ |

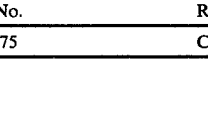

| No. | R₁ |
|---|---|
| 75 | CH₃ |

-continued

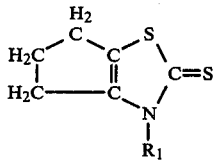

| No. | R₁ |
|---|---|
| 76 | CH₃ |

No. 77

No. 78

The compounds shown above as examples of desirable thione compounds include some novel compounds which can be easily synthesized according to the known methods. The procedure of synthesis for the compound No. 70 is described below.

Synthesis of compound No. 70:

Into a mixture of 80 ml of water and 100 ml of methanol, were dissolved 13.9 g of hydroxylamine hydrochloride and 39.3 g of potassium acetate. Into the mixture, while being cooled in ice and stirred, was added dropwise a solution of 15.2 g of carbon disulfide in 15 ml of methanol. To the resulting mixture which had been stirred for 2 hours while being cooled in ice, was added dropwise a solution of 9.3 g of chloroacetone in 20 ml of methanol. After having been stirred for 2 hours while cooling in ice, methanol was removed from the reaction mixture by evaporation in vacuo on a water bath. Ethanol was added to the residue to precipitate crystals which were removed by filtration. The filtrate was evaporated to dryness under reduced pressure on a water bath and purified by column chromatography to yield 5 g of white crystals melting at 156°–157° C. (decomposition).

The thione compound according to this invention may be used either as dissolved in a diffusion transfer processing solution in an amount of about 10 mg/liter to about 5 g/liter or as incorporated in at least one of the layers constituting a photographic printing plate material in an amount of about 0.5 mg to about 1 g per square meter. A combination of two or more of the thione compounds may also be used. Other organic compounds having a mercapto or thione group may of course be used jointly with the thione compound specified herein.

Japanese Patent Publication No. 29,723/73 discloses that the ink receptivity of a printing plate may be augmented by applying an organic compound having a mercapto or thione group to the surface of a printing plate after the developing treatment by the DTR process. The thione compound according to this invention also increases the ink receptivity to a certain degree by applying to the transferred silver pattern after the developing treatment. However, the increase in ink receptivity thus obtained is smaller than that obtained by the use of those organic compounds described in the above-noted Patent Publication. In order to augment appreciably the ink receptivity, it is advantageous for the organic compound to have a relatively lipophilic group such as an alkyl group having a large number of carbon atoms or a phenyl group. So is perhaps the case with organic compounds described in above-noted Japanese Patent Application "Kokai" (Laid-open) No. 26,201/72. However, the present inventors found that when a thione compound herein specified is allowed to be present in the diffusion transfer developer or/and in the photographic printing plate material and the developing treatment is carried out by the DTR process, it is possible to obtain a remarkably high printing endurance not attainable by the organic compounds disclosed in the above-noted patent literature, and accomplished the present invention. It seems that the thione compound according to this invention exerts a peculiar effect so as to optimize the printing characteristics of the transferred silver grains during the diffusion transfer development.

In a preferred example of the photographic material suitable for use in the present method, the particles of physical development nuclei are not completely embedded in the binder matrix but partially exposed at the surface as disclosed in Japanese Patent Publication Nos. 30,562/73 and 16,725/73 and in Japanese Patent Application "Kokai" (Laid-open) No. 21,602/78.

The developing agents to be incorporated in the photographic material suitable for the activating treatment are known dihydroxybenzenes such as, for example, hydroquinone and 3-pyrazolidones such as, for example, 1-phenyl-3-pyrazolidone. Although the amount used of such a developing agent can be any, it is generally 0.2 to 2, preferably 0.3 to 1.5 g/m² for hydroquinone and 0.01 to 1, preferably 0.02 to 0.5 g/m² for 1-phenyl-3-pyrazolidone. The developing agent can be incorporated in at least one of the layers containing a hydrophilic binder, such as silver halide emulsion layer, anti-halation layer, and a layer containing physical development nuclei.

Although the method of this invention is most suitable for the treatment with an alkaline activating solution, it can also be used in the treatment with an alkaline developer containing a developing agent.

The silver halide in the emulsion layer used in the present invention can be any of the silver chloride, silver bromide, silver chlorobromide, and mixtures of these halides with silver iodide. Preferred halide is a silver halide containing about 70 mole-% or more of silver chloride. The size, crystal habit, and size distribution of silver halide grains are subject to no restriction. The silver halide emulsion can be prepared by any of the methods known to the art. The silver halide emulsion can be sensitized either chemically or spectrally to blue, green or red. If necessary, other additives such as antifoggants, stabilizers, hardeners, and matting agents (graining agents) may be added.

A suitable binder for the silver halide emulsion is gelatin which can be partially or entirely substituted by other natural and/or synthetic hydrophilic colloids such as, for example, albumin, casein, polyvinyl alcohol, sodium alginate, and carboxymethylcellulose.

The weight ratio of a hydrophilic colloid to the silver halide in terms of silver nitrate is generally from 0.2 to 5, preferably from 0.2 to 2.0. The amount of silver halide, in terms of silver nitrate, coated on a support is about 0.1 to about 5 g/m$^2$, preferably 0.2 to 3.0 g/m$^2$. A photographic material containing silver halide at a coverage of about 1 g/m$^2$ or less, preferably about 0.8 g/m$^2$ or less in terms of silver nitrate is especially useful as described previously.

The support can be any of those commonly used in the art, such as, for example, paper, glass, films such as acetylcellulose film, polyvinylacetal film, polystyrene film, polypropylene film, polyethylene terephthalate film; composite films such as a polyester, polypropylene or polystyrene film coated with polyethylene; sheet metals, metallized paper sheets, and metal/paper laminates. A paper support coated on one or both sides with an α-olefin polymer such as polyethylene is useful. The support can be incorporated with an anti-halation dye or pigment. These supports can be used in a photographic material for printing plate having a layer containing physical development nuclei (image receiving layer) and no silver halide emulsion layer, as described in Japanese Patent Publication No. 16,725/73.

In a photographic material having on a support both the silver halide emulsion layer and the physical development nuclei layer, either layer may be superposed on the other, but preferably the physical development nuclei layer (image receiving layer) forms a top layer.

As the physical development nuclei, may be used metals such as antimony, bismuth, cadmium, cobalt, palladium, nickel, silver, lead, and zinc, and sulfides of these metals. The image receiving layer may contain no hydrophilic colloid or may contain hydrophilic colloids such as gelatin, carboxymethylcellulose, gum arabic, sodium alginate, hydroxyethylstarch, dextrin, hydroxyethylcellulose, polystyrenesulfonic acid, vinylimidazoleacrylamide copolymer, and polyvinyl alcohol, etc.

The lithographic printing plates which can be especially preferably used in this invention are those which have on a silver halide emulsion layer an image receiving layer which is made very thin so that amount of hydrophilic colloid in the image receiving layer is about 0.1 gr/m$^2$ or less as disclosed in said Japanese Patent Application "Kokai" (Laid-open) No. 21602/78. This is because in such lithographic printing plates much of the transfer silver is exposed on the surface and printing ink is inked to the surface utilizing the oleophilicity of this transfer silver.

Further, the image receiving layer may contain hygroscopic substances such as, for example, sorbitol and glycerol; anti-scumming pigments such as barium sulfate, titanium dioxide, china clay, silver; and hardening agents such as formaldehyde.

The diffusion transfer processing solutions may contain alkaline substances such as, for example, sodium hydroxide, potassium hydroxide, trisodium phosphate; silver halide solvents such as, for example, sodium thiosulfate, potassium thiocyanate, 2-mercaptobenzoic acid, cyclic imide compounds, and alkanolamines; preservatives such as sulfites; thickeners such as, for example, hydroxyethylcellulose, and carboxymethylcellulose; antifoggants such as, for example, potassium bromide; developing agents such as, for example, hydroquinone and 1-phenyl-3-pyrazolidone; and development modifiers such as, for example, polyoxyalkylene compounds and onium compounds. The pH of the diffusion transfer processing solutions may be about 10 to 14.

The lithographic printing plate prepared according to this invention can be convereted into ink receptive or augmented in ink receptivity with compounds as mentioned in Japanese Patent Publication No. 29723/73 and U.S. Pat. No. 3,721,559. The printing is performed in a known manner using a common etch solution and a common fountain solution.

The invention is illustrated below with reference to Examples, but the invention is not limited thereto.

EXAMPLE 1

On one side of a both sides polyethylene coated paper, 135 g/m$^2$ in basis weight, was provided a matting layer containing silica particles of 5μ in average size. On the opposite side which had been treated with corona discharge, was provided an anti-halation layer (gelatin 3.5 g/m$^2$) containing carbon black and 1-phenyl-3-pyrazolidone (0.2 g/m$^2$) and overcoated with an orthochromatically sensitized high speed silver chloride emulsion containing silica particles of 5μ in average size at a coverage of 1.8 g/m$^2$ in terms of silver nitrate. Both the antihalation layer and the emulsion layer contained formalin as hardening agent. After drying and heating at 40° C. for 3 days, the emulsion layer was overcoated with a palladium sulfide sol containing the polymer No. 3 described in Japanese Patent application "Kokai" (Laid-open) No. 21,602/78 and hydroquinone (0.7 g/m$^2$) to obtain a photographic material for lithographic printing plate.

The photographic material obtained above was exposed imagewise in a letterpress camera provided with an image reversing mechanism and developed with the following silver complex diffusion tranfer developer at 30° C. for 1 minute.

| Transfer developer: | |
| --- | --- |
| Water | 700 ml |
| Potassium hydroxide | 20 g |
| Anhydrous sodium sulfite | 50 g |
| 2-Mercaptobenzoic acid | 1.5 g |
| 2-Methylaminoethanol | 15 g |
| Organic compound | 1.0 g |
| Water to make up to | 1 liter |

The "organic compound" in the above formulation indicates a thione compound used according to this invention, or a reference compound, both as shown in Table 1.

After the development, the photographic material was passed through a pair of squeeze rollers to remove the excess developer and immediately treated with a neutralizer of the following composition at 25° C. for 20 seconds. After removal of an excess of the solution by a pair of squeeze rollers, the material was dried at room temperature.

| Neutralizer: | |
| --- | --- |
| Water | 600 ml |
| Citric acid | 10 g |
| Sodium citrate | 35 g |
| Colloidal silica (20% suspension) | 5 ml |
| Ethylene glycol | 5 ml |
| Water to make up to | 1 liter |

The lithographic printing plate thus prepared was mounted on an offset press and the plate surface was thoroughly supplied with the following etch solution. The printing was performed using the following fountain solution.

| Etch solution: | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Fountain solution: | |
| Orthophosphoric acid | 10 g |
| Nickel nitrate | 5 g |
| Sodium sulfite | 5 g |
| Ethylene glycol | 100 g |
| Colloidal silica (20% suspension) | 28 g |
| Water to make up to | 2 liters |

The printing press used was A. B. Dick 350 CD (a tradename for an offset press manufactured by A. B. Dick Co.). The results of tests for ink receptivity and printing endurance carried out in the following manner were as shown in Table 1.

Ink receptivity: As soon as the inking roller touched the printing plate surface, the feeding of paper was started. The ink receptivity was evaluated by counting the number of copies before a sufficient image density had been attained.

Printing endurance: The printing endurance was evaluated in terms of the number of good copies obtained before the printing had become impossible owing to either the unsatisfactory ink spread in the image area or the scumming (ground staining).

TABLE 1

| Processing solution | Organic compound | Ink receptivity | Printing endurance |
|---|---|---|---|
| | (Thione compound) | | |
| A | 1 | 5-10 | ≧10,000 |
| B | 10 | " | " |
| C | 22 | " | " |
| D | 36 | " | " |
| E | 48 | " | " |
| F | 51 | " | " |
| G | 57 | " | " |
| H | 64 | " | " |
| I | 75 | " | " |
| J | 77 | " | " |
| | Reference compound | | |
| K | A | " | 4,500 |
| L | B | " | 5,000 |
| M | C | " | 4,500 |
| N | D | 35-40 | ≦3,000 |
| O | E | 10-15 | " |
| P | F | 30-35 | " |
| Q | G | " | " |
| R | H | 10-15 | 4,500 |
| S | I | 10-15 | ≦3,000 |
| T | J | 30-35 | " |
| U | K | 15-20 | " |
| V | L | 5-10 | 5,000 |
| W | M | 35-40 | ≦3,000 |
| X | N | " | " |
| Y | — | 15-20 | 4,000 |

The reference compounds A to N, used for comparison, were as shown below.

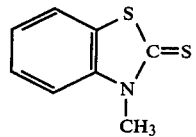

A

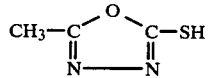

B

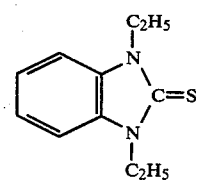

C

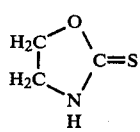

D

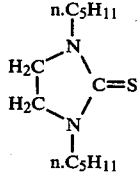

E

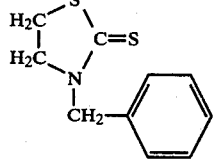

F

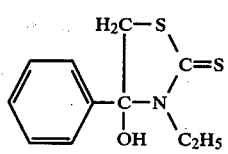

G

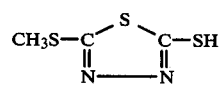

H

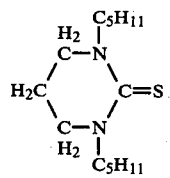

I

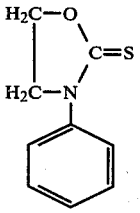

J

-continued

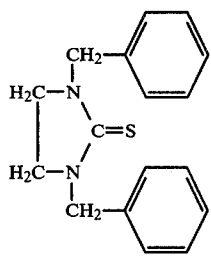
K

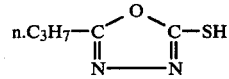
L

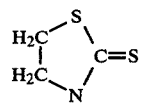
M

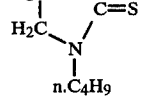
N

From the results shown in Table 1, it is apparent that as compared with the reference compounds, the thione compounds according to this invention showed a remarkable increase in printing endurance. Some of the reference compounds interfered with the precipitation of transferred silver and even showed a decrease in ink receptivity and printing endurance, as compared with the results of control experiment using no organic compound, indicating the peculiarity of the thione compound according to this invention.

EXAMPLE 2

A photographic material for printing plate was prepared in the same manner as in Example 1, except that the silver content was 0.6 g/m² in terms of silver nitrate. The material was treated in the same manner as in Example 1. The results obtained were as shown in Table 2. It is seen from the results that marked improvement in the printing plate of a low silver content was obtained when a thione compound was used according to this invention, as compared with the printing plate of low silver content prepared by using a reference compound. Therefore, it is understandable that the method of this invention is useful in producing a lithographic printing plate of low silver content.

Further, as compared with printing plates prepared by using the reference compounds, those prepared by using the thione compounds according to this invention showed superior reproduction of fine line pattern of the original. Moreover, the fine line area of the printing plate of this invention resisted against mechanical abrasion for a long period of printing.

TABLE 2

| Processing solution | Organic compound | Ink receptivity | Printing endurance |
|---|---|---|---|
|  | (Thione compound) |  |  |
| 1 | 2 | 10–15 | ≧8,000 |
| 2 | 5 | " | " |

TABLE 2-continued

| Processing solution | Organic compound | Ink receptivity | Printing endurance |
|---|---|---|---|
| 3 | 7 | " | " |
| 4 | 10 | " | " |
| 5 | 11 | " | " |
| 6 | 13 | " | " |
| 7 | 15 | " | " |
| 8 | 17 | " | " |
| 9 | 26 | " | " |
| 10 | 30 | " | " |
| 11 | 33 | " | " |
| 12 | 35 | " | " |
| 13 | 44 | " | " |
| 14 | 46 | " | " |
| 15 | 51 | " | " |
| 16 | 52 | " | " |
| 17 | 55 | " | " |
| 18 | 58 | " | " |
| 19 | 63 | " | " |
| 20 | 64 | " | " |
| 21 | 65 | " | " |
| 22 | 68 | " | " |
| 23 | 70 | " | " |
| 24 | 75 | " | " |
|  | Reference compound |  |  |
| 25 | C | " | 2,500 |
| 26 | E | 20–30 | ≦500 |
| 27 | F | 45–55 | " |
| 28 | L | 10–15 | 2,500 |
| 29 | O | 30–35 | 2,000 |
| 30 | P | " | 2,500 |
| 31 | Q | " | " |
| 32 | — | 35–40 | 2,000 |

The reference compounds (O to Q) used for comparison were as shown below.

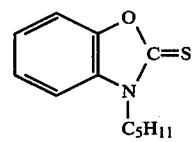
O

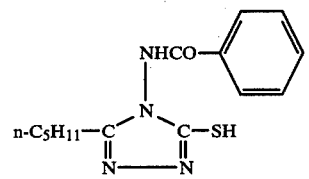
P

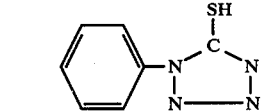
Q

EXAMPLE 3

The photographic material for printing plate obtained in Example 1 was treated with the processing solution B or E, used in Example 1 to determine the number of printing plates (B-4 size, Japan) processed with a given volume of the same solution until the photographic characteristics (contrast, etc.) and the printing characteristics (printing endurance, etc.) of the transferred silver had become deteriorated too much to maintain the level of printing quality obtained in Example 1. The results obtained were as shown in Table 3.

TABLE 3

| Processing solution | Number of printing plates processed per liter of solution |
|---|---|
| B | 170 |
| E | 160 |

It is possible to render the alkaline activating solution more durable by the use of a thione compound according to this invention.

EXAMPLE 4

The photographic material for printing plate obtained in Example 2 was treated with the processing solution 15, 21, or 28 to determine the number of printing plates (B-4 size, Japan) processed with a given volume of the same solution until the photographic characteristics (contrast, etc.) and the printing characteristics (printing endurance, etc.) of the transferred silver had become deteriorated too much to maintain the level of printing quality obtained in Example 2. The results obtained were as shown in Table 4.

TABLE 4

| Processing solution | Number of printing plates processed per liter of solution |
|---|---|
| 15 | 170 |
| 21 | 150 |
| 28 | 100 |

It is seen from Table 4 that as compared with processing and solution 28, the durability of the processing solution 15 or 21 was much improved. It is, therefore, possible to render the alkaline activating solution more durable by the use of a thione compound according to this invention.

EXAMPLE 5

In a manner similar to that in Example 1, the photographic material described in Example 1 was treated with the following transfer developer containing 0.8 g/liter of the thione compound 7, 24, 35, 51, 55, 63 or 65 and similarly finished.

| Transfer developer: | |
|---|---|
| Water | 700 ml |
| Potassium hydroxide | 25 g |
| Anhydrous sodium sulfite | 60 g |
| Sodium thiosulfate | 10 g |
| Thione compound | 0.8 g |
| Potassium bromide | 1.0 g |
| Water to make up to | 1 liter |

There were obtained a large number of clear printed copies without ground staining, as in Example 1.

EXAMPLE 6

The procedure of Example 1 was repeated, except that in preparing the photographic material, the physical development nuclei sol contained the organic compound at a coverage of 15 mg/m$^2$ and the processing solution Y was used. The results obtained were similar to those obtained in Example 1. Similar results were obtained by using the processing solution B, E or G.

What is claimed is:

1. A method of printing with lithographic printing plate made by the silver complex diffusion transfer process comprising diffusion tranferring a diffusible silver complex formed from undeveloped silver halide in an imagewise exposed silver halide emulsion layer and a silver halide complexing agent to a physical development nuclei layer and developing it there to form a transferred silver which is utilized as an ink-receptive area, and wherein the diffusion transfer development treatment is carried out in the presence of at least one thione compound having a non-enolizable thione group, an adjacent nitrogen atom with an attached substituent R and represented by N-R, and a group of atoms which may carry the substituent R, said group of atoms being necessary for forming a 5- or 6-membered ring having no aromatic condensed ring, said substituent R is selected from the group consisting of alkyl, alkoxyalkyl, aminoalky, hydroxyalkyl, carboxyalkyl, acyloxyalkyl, sulfoalkyl, haloalkyl, allyl, amino, alkylamino, dialkylamino, acylamide, hydroxyl, acyloxy, alkylthio, and alkoxy groups which have no carbon atom or have 1 to 3 carbon atoms and then applying ink to the printing plate.

2. A method according to claim 1, wherein said group of atoms necessary for forming the 5- or 6-membered ring is selected from the group consisting of C, N and S atoms.

3. A method according to claim 1, wherein the photographic material has on a silver halide emulsion layer an image receiving layer which contains at most about 0.1 g/m$^2$ of hydrophilic colloid.

4. A method according to claim 1, wherein the photographic material contains silver halide in an amount of about 1 g/m$^2$ or less in terms of silver nitrate.

5. A method according to claim 1, wherein the thione compound is contained in the diffusion transfer developer.

6. A method according to claim 5, wherein the amount of the thione compound is about 10 mg/liter to about 5 g/liter.

7. A method according to claim 1, wherein the thione compound is contained in at least one of the layers constituting a photographic material.

8. A method according to claim 7, wherein the amount of the thione compound is about 0.5 mg/m$^2$ to about 1 g/m$^2$.

9. A method according to claim 1, wherein R of >N-R is a substituent having 1 to 2 carbon atoms or no carbon atoms which are selected from the group consisting of alkyl, methoxymethyl, aminoalkyl, hydroxyalkyl, carboxyalkyl, sulfoalkyl, haloalkyl, amino, alkylamino, dimethylamino, acylamido, hydroxy, acyloxy and alkoxy.

10. A method according to claim 1, wherein the thione compound is selected from the group consisting of those represented by the following general formula wherein R$_1$–R$_6$ are the same as R defined before and X is selected from O and S:

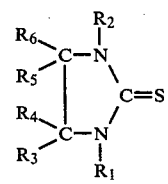

-continued
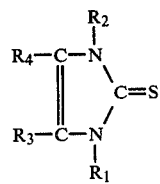
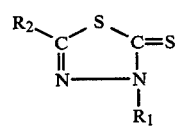
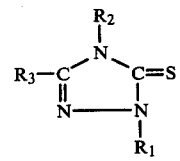
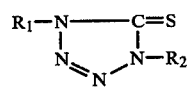
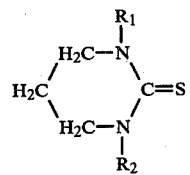
-continued
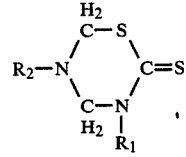
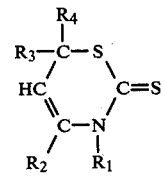
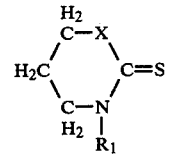
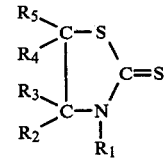
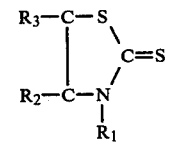
* * * * *